(12) United States Patent
Bangert

(10) Patent No.: US 7,649,770 B2
(45) Date of Patent: Jan. 19, 2010

(54) PROGRAMMING MATRIX

(75) Inventor: Joachim Bangert, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 275 days.

(21) Appl. No.: 10/592,783

(22) PCT Filed: Mar. 10, 2005

(86) PCT No.: PCT/EP2005/051088

§ 371 (c)(1),
(2), (4) Date: Sep. 14, 2006

(87) PCT Pub. No.: WO2005/091505

PCT Pub. Date: Sep. 29, 2005

(65) Prior Publication Data

US 2008/0143382 A1    Jun. 19, 2008

(30) Foreign Application Priority Data

Mar. 15, 2004    (DE)    ................ 10 2004 012 530

(51) Int. Cl.
*G11C 11/15* (2006.01)
*G11C 11/00* (2006.01)
*H01L 25/00* (2006.01)
(52) U.S. Cl. ............ 365/173; 365/158; 326/41
(58) Field of Classification Search ............ 326/37–41, 326/47; 716/16; 356/158, 171, 173
See application file for complete search history.

(56) References Cited

U.S. PATENT DOCUMENTS 6,754,123 B2 *    6/2004    Perner et al. ................ 365/209

| | | | |
|---|---|---|---|
| 6,831,854 B2 * | 12/2004 | Rinerson et al. | 365/158 |
| 7,116,576 B2 * | 10/2006 | Smith et al. | 365/171 |
| 7,411,814 B2 * | 8/2008 | Lenssen | 365/158 |
| 2002/0102828 A1 | 8/2002 | Schlosser et al. | |
| 2004/0240258 A1 * | 12/2004 | Bangert | 365/158 |
| 2004/0252551 A1 * | 12/2004 | Iwata et al. | 365/158 |
| 2006/0092689 A1 * | 5/2006 | Braun et al. | 365/158 |

FOREIGN PATENT DOCUMENTS

WO    03/026131    3/2003

OTHER PUBLICATIONS

Ranmuthu I W et al: "Magneto-resistive elements-an alternative to floatin gate technology" Circuits and Systems, 1992., Proceedings of the 35 TM Midwest Symposium on Washington, DC, USA Aug. 9-12, 1992, New York, NY, USS IEEE, US, Aug. 9, 1992 pp. 134-13.*

(Continued)

*Primary Examiner*—Vibol Tan
*Assistant Examiner*—Dylan White
(74) *Attorney, Agent, or Firm*—Young & Thompson

(57) ABSTRACT

A programming matrix switches of one of n logical inputs to one of j outputs. The programming matrix includes at least one layer system with multiple magnetic elements situated at selected locations, in which case, during and/or after the formation of the layer system, in the case of at least one of the elements, the magnetic and/or electrical properties thereof can be altered or are altered by means of intervention at least one layer of the element.

18 Claims, 4 Drawing Sheets

OTHER PUBLICATIONS

Ranmuthu I W et al: "Magneto-resistive elements-an alternative to floatin gate technology" Circuits and Systems, 1992., Proceedings of the 35th Midwest Symposium on Washington, DC, USA Aug. 9-12, 1992, New York, NY, USS IEEE, US, Aug. 9, 1992 pp. 134-135.

Mafple D et al: "Programming antifuses in Crosspoint's FPGA" Custom Integrated Circuits Conferende, 1994., Proceedings of the IEEE 1994 San Diego, CA, USA May 1-4, 1994, New York, NY, USA, IEEE, May 1, 1994.

* cited by examiner

PROGRAMMING MATRIX

BACKGROUND OF THE INVENTION

1. Field of the Invention

The invention relates to a programming matrix for the switching of one of n logic inputs to one of j outputs.

2. Description of the Related Art

A programming matrix generally makes a selection for switching signals from one of n logic inputs to one of j lines, which are then processed further. The programming of the matrices of programmable logic is realized in various ways in practice in the case of a PLA (Programmable Logic Array). Firstly, it is possible to perform fixed programming by means of a dedicated mask during production. Furthermore, it is known to carry out one-time, but free programming by destroying integrated fuses. A third customary possibility is nonvolatile programming, which is erasable. The fourth possibility is volatile programming with data from an external storage device.

The appropriate method is selected depending on the respective tasks of the programmed logic circuit. For security reasons, fixed programming by means of a special mask is preferred for secret know-how, since the logic combinations are difficult to read out. With the special mask, either lines are laid in special mask planes to which the logic cells to be programmed are connected, or corresponding electrical connections are set during production by means of vias or plugs. However, the programming requires fabrication of specific masks and the items of information are difficult to read out and, in the case of more complex functions, can be determined only by "Reverse Engineering". Programming errors or updates require the production of new masks and new chips, that is to say that the already finished masks and chips have to be destroyed.

One-time, free programming by destroying integrated fuses involves either creating connections which are open in the unprogrammed state (antifuse), or destroying fuses which are closed in the unprogrammed state. The connections can either forward items of information directly or drive a path transistor. Examples of this are one-time programmable PROM cells that acquire a conductive channel as a result of the programming. All lines that are possible are laid during the destruction of fuses. In a specific programming mode, built-in fuses are destroyed by thermal overloading. However, considerable current densities and relatively high voltages are required for the programming. Destroyed fuses are irreversible, that is to say the incorrectly programmed components have to be destroyed.

Nonvolatile programming, which is erasable, can be used to update firmware, even after delivery to the customer, by incorporating a new ROM. What is disadvantageous, however, is that there is no security against read-out or copying. Moreover, nonvolatile programming in an EEPROM suffers from the disadvantage that the number of programming cycles is limited and the programming speed is low. Furthermore, cells of this type require a large area.

Volatile programming with data from an external storage device likewise enables firmware to be subsequently updated. In this case, the data are loaded from an external storage device (e.g. flash memory or EEPROM) which is read when the voltage supply is switched on in a booting operation. The data of the external storage device can easily be determined or even manipulated. When the voltage supply is switched off, the programming is lost. The possible combinations are designed as a transistor cell whose channel is inhibited or enabled by the programming (path transistor). A cell having a high data transfer rate requires a relatively large amount of area and a complicated and expensive production technology. The programming can be rapidly changed after booting; however, this change cannot be provided in a simple manner during the next booting.

A considerable disadvantage of known programming matrices is that a dedicated production technology is required for each of the designs mentioned. This means that it is also necessary to define for each technology dedicated programming instructions that are neither compatible nor interchangeable across technologies.

An application of magnetoresistive elements to so-called "Floating Gate Technology" is disclosed in an article by Ranmuthu et al. ("Magneto-resistive elements—an alternative to floating gate technology" CIRCUITS AND SYSTEMS, 1992, PROCEEDINGS OF THE 35TH MIDWEST SYMPOSIUM ON WASHINGTON, DC, USA 9-12 Aug. 1992, NEW YORK, NY, USA; IEEE, US, Aug. 9, 1992, pages 134-136, XP010057781 ISBN: 0-7803-0510-8). In this case, SRAM cells which determine the signal flow are provided at crossover points of a programmable logic device. The magnetoresistive elements which are assigned to those crossover points are used to store the status of the crossover points. During booting, the switching states of the magnetoresistive elements are then transferred into the SRAM again.

A discourse on the programming of "antifuses" in fine grain architectures can be found in an article by Marple and Cooke ("Programming antifuses in Crosspoint's FPGA" CUSTOM INTEGRATED CIRCUITS CONFERENCE, 1994 SAN DIEGO, CA, USA 1-4 May 1994, NEW YORK, NY, USA, IEEE, May 1, 1994, pages 185-188, XP010129897 ISBN: 0-7803-1886-2). This describes the programming of the "antifuses" for "Programmable Logic Devices" (PLDs) and "field programmable gate arrays" (FPGAs).

BRIEF SUMMARY OF THE INVENTION

Therefore, the invention is based on the problem of specifying a programming matrix which avoids the disadvantages mentioned, enables high flexibility during programming and can be produced in a simple manner.

Accordingly, the programming matrix is designed for a programmable logic in a layer system with one or a plurality of elements which are formed with magnetic layers of the layer system. The advantages of the individual variants with fixed programming, one-time programming, nonvolatile programming and volatile programming are thereby combined in a single programming matrix. The programming matrix according to the invention can be implemented with the same magnetic layer system in the same technology or different technologies.

The magnetic layer system of the programming matrix according to the invention may be of the AMR type (anisotropic magnetoresistive) and/or GMR type (giant magnetoresistive) and/or TMR type (tunneling magnetoresistive). Known magnetic layer systems that are used for MRAM memories, for example, can be utilized in this way since these are advantageous with regard to the temperature stability, radiation resistance and integration possibilities.

In a further refinement of the invention it may be provided that the magnetic layer system has a plurality of stacked magnetic layers. The space requirement is particularly small in the case of a multilayer system. The three-dimensional arrangement also considerably increases the combination possibilities.

The intervention that is to be performed at the at least one element may advantageously lead to a structural alteration of the construction of the element. That is to say that at the at least one layer of the element, an intervention, e.g. a structuring or a removal by mechanical, optical or electrical means, is performed such that afterward the construction of the element overall has been altered.

The general aim of such alterations is particular settings or a programming of the programming matrix in order either to forward data from an input to an output of the matrix (so-called "activation") or else actually to prevent such forwarding (so-called "passivation").

Generally it is advantageously possible for properties of the at least one element to be set or for changes to be made by means of a mask technique. A technique of this type is particularly suitable for acting on discrete regions and/or layers of an element.

Thus, it is possible in particular to effect the intervention at the at least one layer of the at least one magnetic element for the purpose of changing the electrical properties during and/or after the formation of the layer. Such an intervention may, of course, also be accompanied by a structural change in the construction of the element, as discussed above.

What can thus be achieved, for example, is that the resistance is low in the region of a magnetic element and is preferably high in the region adjacent thereto.

It is particularly preferably the case that the layer system of the programming matrix according to the invention can be produced by means of a mask programming. In this case, the programming can take place by means of a mask which places magnetic elements only where they are required. After completion, the resistance is low where an element is situated and high where no element has been programmed or positioned. In particular, the resistance of the magnetic element can be reduced further by short-circuiting if a TMR layer system is used. Short-circuiting means a deliberate destruction of the tunnel barrier.

In the case of a GMR layer system, which may be employed e.g. in a sensor, a smallest possible element size is preferred. In this case, the resistance is lower and the sensitivity to external magnetic fields is lower.

As an alternative, the programming may also take place by means of a mask which removes magnetic elements where they are not required.

The programming matrix according to the invention may have a layer system that can be produced e.g. in an antifuse technique, in particular a TMR layer system, an intact tunnel barrier of the layer system corresponding to a high resistance and a broken-down tunnel barrier corresponding to a low resistance. This possibility exploits the fact that the tunnel barrier breaks down irreversibly at a specific applied voltage. A very low electrical resistance remains after the breakdown of the barrier. In this case, an intact barrier is registered as high resistance and a broken-down barrier as low resistance. Moreover, it is advantageous that the energy required per fuse is very low. This construction can be realized analogously in GMR and AMR layer systems, too. In this case, plugs or magnetic layer systems are interrupted by a current surge.

In addition to or instead of a change in the electrical properties, the intervention at the at least one layer of the at least one magnetic element may also lead to the change in the magnetic properties during and/or after the formation of the layer. In this case, too, such an intervention may, of course, be accompanied by a structural change in the construction of the element, as discussed above.

In this case, it is to be regarded as particularly advantageous that the intervention at the at least one layer of the at least one magnetic element may perform storage of a magnetic configuration of the relevant element.

Furthermore, it may be provided that a programming takes place by means of a mask which brings about an activation or passivation of the magnetic element by means of various measures. Passivated elements do not exhibit any dependence of the resistance on the logic information present and thus reliably inhibit the forwarding of the information. By combining the different possibilities with one another, further combination possibilities arise. The aim of such alterations is settings or a programming of the programming matrix, where the adjective "active" is to be understood to mean that data are forwarded from an input to an output of the matrix, while the adjective "passive" means that such forwarding is not effected.

The programming matrix according to the invention may have at least one programmed or programmable gate cell for storing a data bit, the resistance of the gate cell corresponding to the logic state "0" or "1". A programming by means of the stored state which determines the resistance of the cell is made possible in this way. In this case, the combination information items are stored in a data area and processed further like normal logic data; by way of example, a gate circuit, in particular an AND gate, can be driven thereby. Gate cells of this type have the advantage that they are reprogrammable like normal cells. A field programming of the combination is likewise possible in a simple manner.

In a further refinement of the invention, it may be provided that a logic cell can be brought to a passive state by programming of the reference layer at an angle of 90° with respect to the storage layer. In this case, the reference layer of the magnetic element is programmed permanently at an angle of 90° with respect to the storage layer. The reference layer situated at an angle of 90° with respect to the storage layer supplies the same TMR signal for both possible magnetizations of the storage layer, with the result that the logic cell is independent of the input signal and the input signal is blocked.

It is to be considered as particularly advantageous that, in the case of the programming matrix according to the invention, it is possible to effect an intervention at the at least one layer of the at least one magnetic element for the purpose of changing simultaneously the magnetic and electrical properties during and/or after the formation of the layer.

BRIEF DESCRIPTION OF THE DRAWING FIGURES

Further advantages and details of the invention emerge from the exemplary embodiments described below and with reference to the drawings, in which.

DETAILED DESCRIPTION OF THE INVENTION

The general aim of the measures according to the invention that are discussed in detail below is to permit particular settings or programmings of a programming matrix in order either to forward data from an input to an output of the matrix (so-called "activation") or else actually to prevent such forwarding (so-called "passivation").

Figure 1:
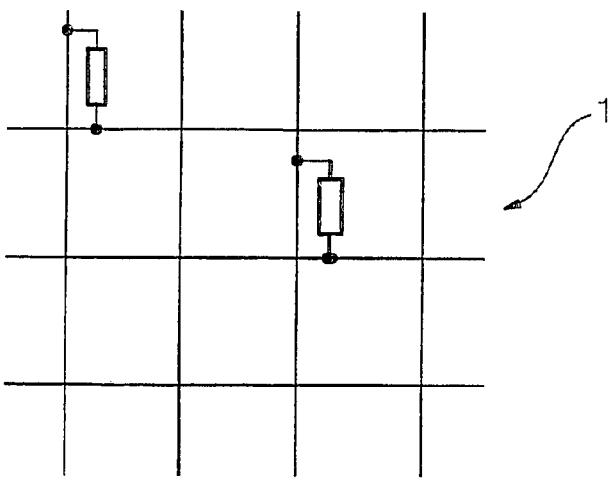
FIG. 1 shows a programming matrix according to the invention with fixed programming.

The programming matrix 1 illustrated in FIG. 1 has fixed programming. During the production of the layer systems, the magnetic layer system is deposited in large-area fashion and the selected regions are etched free. As an alternative, the layer system can also be deposited onto preprocessed resist with gaps at the corresponding locations. In this case, conductive regions remain at the selected crossover points as a combination, that is to say as an "active" combination of the matrix.

Figure 2A:
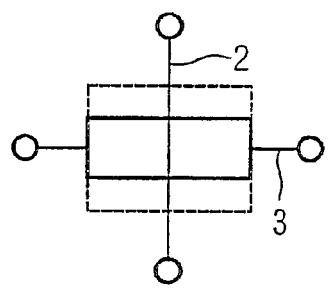
FIG. 2a shows a cell of a programming matrix according to the invention in the conducting setting.
Figure 2B:
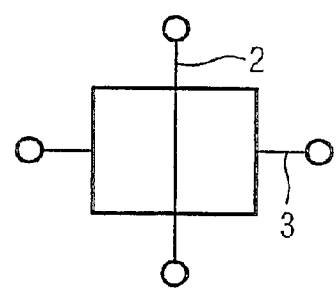
FIG. 2b shows a cell of a programming matrix according to the invention in the inhibit setting.

FIG. 2a shows a cell of a programming matrix in the conducting direction. The rectangular magnetic cell of FIG. 2a has a greater coercive field strength than the approximately square magnetic element shown in FIG. 2b. The magnetic element of FIG. 2a can be formed by means of an additional mask. This exploits the effect that the programming of the states "conduction" (="active" combination) and "inhibiting" (="passive" combination) takes place by means of different coercive field strengths in the cores. For this purpose, mask programming is used by setting shape anisotropies in the cores. FIGS. 2a and 2b each show the plan view of the magnetic layer. With a predetermined current intensity passing via the line 2 the magnetic element of FIG. 2a can be switched, whereas the magnetic element of FIG. 2b cannot be set by the current flowing via the input line 2, with the result that the information is not forwarded to the output line 3.

Figure 3:
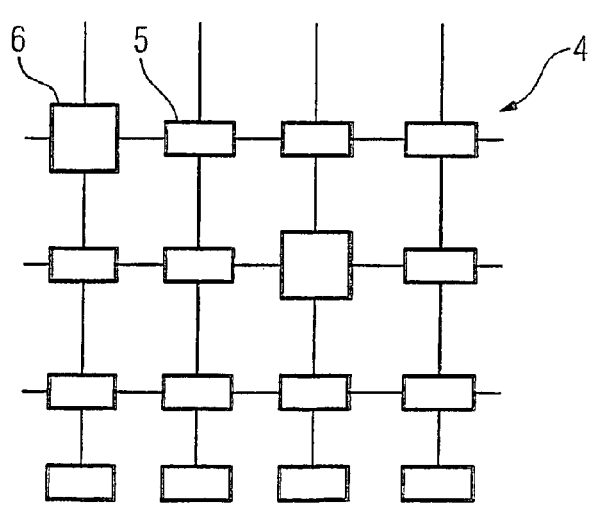
FIG. 3 shows a programming matrix constructed from the cells shown in FIGS. 2a and 2b.

FIG. 3 shows a programming matrix constructed from the cells shown in FIGS. 2a and 2b.

The programming matrix 4 shown in FIG. 3 has rectangular elements 5 and square elements 6. As an alternative, it is possible to form a square geometry with a mask comprising rectangular inhibiting elements.

By means of a masking, it is possible for specific regions of the layer system to be irradiated, with the result that the irradiation leads to a destruction of the magnetic properties in the uncovered zones.

Figure 4:
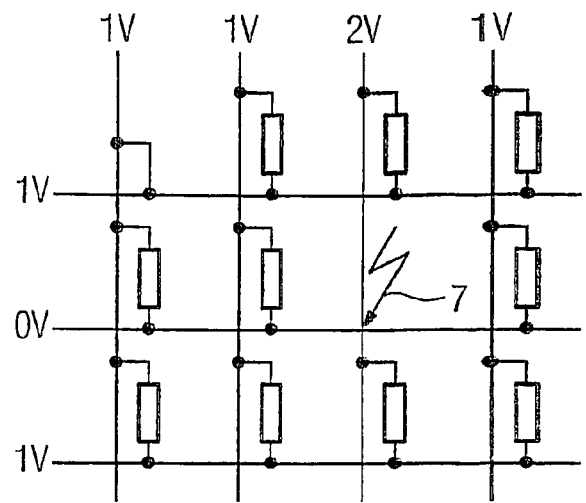
FIG. 4 shows the programming of a programming matrix according to the invention by the destruction of TMR fuses.

FIG. 4 shows the programming of a programming matrix by the destruction of integrated TMR fuses as an intervention measure. The input lines run in the vertical direction and the output lines run in the horizontal direction. The targeted breakdown of the barrier, which takes place at 2 volts, can be realized by connecting the entire programming matrix to a voltage of +1 volt with respect to a reference potential. The line of the selected cell is connected to 0 volts and the row (column) of the selected cell is connected to +2 volts. Line and row may also be interchanged, of course. This results in an electrical loading of the cells of 0 volts in the array or 1 volt on the selected line and row, apart from the programmed cell 7. The voltage of 2 volts is present at the programmed cell 7 and destroys the thin tunnel oxide. Consequently, this cell is now to be considered as "activated" while undestroyed cells are to be regarded as "passive".

Figure 5:
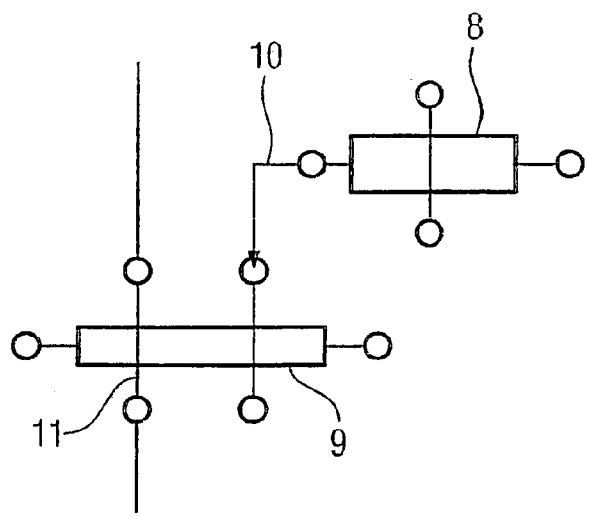
FIG. 5 shows a gate cell connected to an AND gate.

FIG. 5 shows a gate cell connected to an AND gate.

A gate cell makes use of nonvolatile storage of logic states. Consequently, nonvolatile programming is present, which is erasable, however, that is to say reprogrammable. The state programmed in a memory 8 is available until reprogramming.

The memory 8 is connected to the AND gate 9 via a line 10. The data path or the line 11 of the AND gate 9 is enabled (=activation) or not enabled (=passivation) depending on the state stored in the memory 8.

Figure 6A:
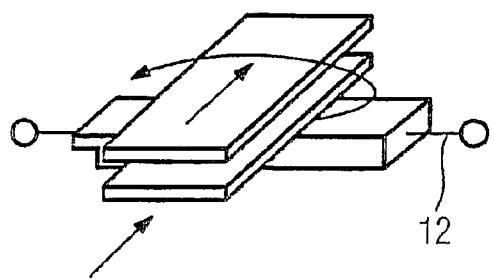
FIGS. 6a, 6b show exemplary embodiments of the gate cell from FIG. 5.
Figure 6B:
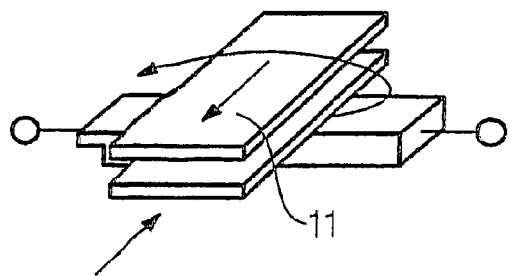

FIGS. 6a and 6b show exemplary embodiments of the gate cell illustrated in FIG. 5. In the cell shown in FIG. 6a, the two magnetic fields are added and in total attain the coercivity of the magnetic layer, so that the output 12 is released. In the case of the cell illustrated in FIG. 6b, the coercivity is not exceeded since there a countercurrent flows via the line 11. It is also possible that no current or a weaker current flows.

A programmed gate circuit can likewise be realized elegantly by means of a comparator logic by correspondingly programming the comparison element of an AND gate.

Figure 7:
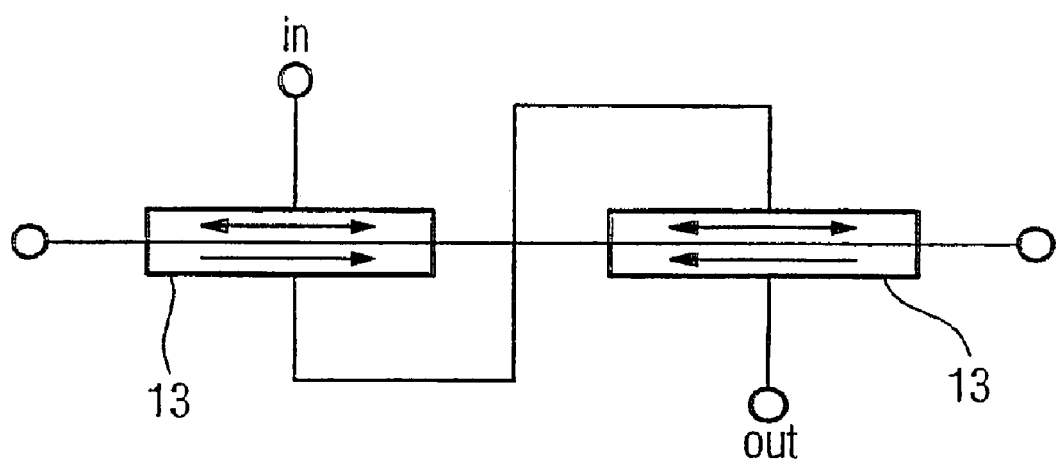
FIG. 7 shows two elements connected in series.

FIG. 7 shows two series-connected elements which are oriented in antiparallel fashion and in which the reference 13 lies in the center. This arrangement is thus to be considered as "passive".

Figure 8:
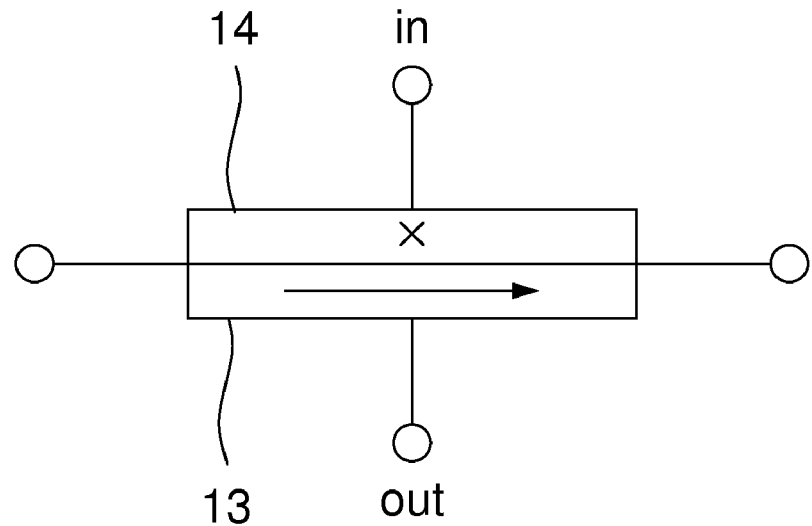
FIG. 8 shows two elements connected in series where the magnetization of the reference layer is oriented "left to right"

In FIG. 8 a logic cell is shown with a reference layer 13 and a storage layer 14. The magnetization of the reference layer is oriented "from left to right" in the drawing. The magnetization of the storage layer is oriented perpendicular to the drawing (i.e. "into" the drawing), which is indicated by the cross.

Figure 9:
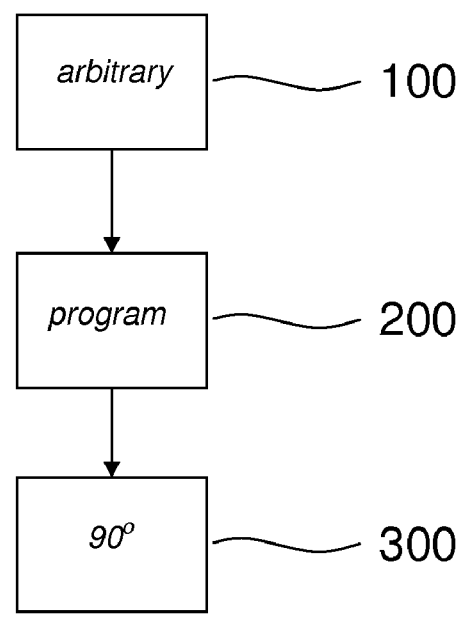
FIG. 9 shows the logic steps of achieving the desired orientation of the magnetizations.

FIG. 9 shows the logic steps of achieving the desired orientation of the magnetizations. In step 100, the magnetizations of the layers are at an arbitrary angle to one another, maybe parallel or antiparallel. In step 200, the magnetization of the reference layer 13 (or of the storage layer 14) is programmed such that in step 300 the magnetization of the reference layer is at an angle of 90° with respect to the storage layer's magnetization.

The invention claimed is:

1. A programming matrix for the switching of one of n logic inputs to one of j outputs, the programing matrix (1, 4) having at least one layer system with a plurality of magnetic elements situated at selected locations, in which case, during and/or after the formation of the layer system, in the case of at least one of the elements, the magnetic and/or electrical properties thereof can be altered or are altered by means of intervention at least one layer of the element,
   wherein the plurality of magnetic elements comprise at least one magnetic element forms a logic cell which can be brought to a passive state by programing of a reference layer at an angle of 90° with respect to a storage layer.

2. The programming matrix as claimed in claim 1, wherein the magnetic layer system is of the AMR type (anisotropic magnetoresistive) and/or GMR type (giant magnetoresistive) and/or TMR type (tunnel magnetoresistive).

3. The programming matrix as claimed in claim 2, wherein the at least one element is a TMR layer element, the resistance of which can be reduced by short-circuiting.

4. The programming matrix as claimed in claim 1, wherein the magnetic layer system has a plurality of stacked magnetic layers.

5. The programming matrix as claimed in claim 1, wherein an intervention leading to a structural alteration of the construction of the at least one magnetic element.

6. The programming matrix as claimed in claim 1, wherein the properties of the at least one magnetic element can be altered by means of a mask technique.

7. The programming matrix as claimed in claim 1, wherein the layer system can be produced by means of a mask programming.

8. The programming matrix as claimed in claim 1, wherein an intervention at the at least one layer of the at least one magnetic element for the purpose of changing the electrical properties during and/or after the formation of the layer.

9. The programming matrix as claimed in claim 1, wherein the resistance is low in the region of a magnetic element and is preferably high in the region adjacent thereto.

10. The programming matrix as claimed in claim 1, wherein the at least one magnetic element can be turned on or off at a selected location.

11. The programming matrix as claimed in claim 1, wherein a layer system with tunnel barriers, an intact tunnel barrier of the layer system corresponding to a high resistance and a broken-down tunnel barrier corresponding to a low resistance.

12. The programming matrix as claimed in claim 1, wherein a part of the layer system or at least one plug can be interrupted by a current that can be applied.

13. The programming matrix as claimed in claim 1, wherein an intervention at the at least one layer of the at least one magnetic element for the purpose of changing the magnetic properties during and/or after the formation of the layer.

14. The programming matrix as claimed in claim 13, wherein the intervention at the at least one layer of the at least one magnetic element effects storage of a magnetic configuration of the relevant element.

15. The programming matrix as claimed in claim 13, wherein a gate circuit, in particular an AND gate, can be driven by the data bit stored in the gate cell.

16. The programming matrix as claimed in claim 1, wherein the at least one magnetic element can be set by activation or passivation, the forwarding of a signal being inhibited in the case of a passivated magnetic element.

17. The programming matrix as claimed in claim 1, wherein with the at least one magnetic element at least one programmed or programmable gate cell is provided for storing a data bit, the resistance of said gate cell corresponding to the logic state "0" or "1".

18. The programming matrix as claimed in claim 1, wherein an intervention at the at least one layer of the at least one magnetic element for the purpose of changing simultaneously the magnetic and electrical properties during and/or after the formation of the layer.

* * * * *